US010347727B2

(12) United States Patent
Cheng et al.

(10) Patent No.: US 10,347,727 B2
(45) Date of Patent: Jul. 9, 2019

(54) FIN-TYPE FET WITH LOW SOURCE OR DRAIN CONTACT RESISTANCE

(71) Applicant: International Business Machines Corporation, Armonk, NY (US)

(72) Inventors: Kangguo Cheng, Schenectady, NY (US); Juntao Li, Cohoes, NY (US); Heng Wu, Guilderland, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/803,951

(22) Filed: Nov. 6, 2017

(65) Prior Publication Data

US 2019/0058045 A1    Feb. 21, 2019

Related U.S. Application Data

(63) Continuation of application No. 15/681,476, filed on Aug. 21, 2017.

(51) Int. Cl.
*H01L 29/417* (2006.01)
*H01L 29/66* (2006.01)
*H01L 29/78* (2006.01)

(52) U.S. Cl.
CPC .... *H01L 29/41791* (2013.01); *H01L 29/6681* (2013.01); *H01L 2029/7858* (2013.01)

(58) Field of Classification Search
CPC .......... H01L 29/41791; H01L 29/6681; H01L 2029/7858
See application file for complete search history.

(56) References Cited

U.S. PATENT DOCUMENTS 6,812,106 B1 * 11/2004 Xiang ............... H01L 21/26506
                                                            438/301
2016/0359008 A1 * 12/2016 Choi ................. H01L 29/41791

OTHER PUBLICATIONS

Cheng et al., "Fin-Type FET With Low Source or Drain Contact Resistance," U.S. Appl. No. 15/681,476, filed Aug. 21, 2017.
List of IBM Patents or Patent Applications Treated as Related; Date Filed: Nov. 6, 2017, 2 pages.

* cited by examiner

*Primary Examiner* — Su C Kim
(74) *Attorney, Agent, or Firm* — Cantor Colburn LLP; Vazken Alexanian

(57) ABSTRACT

Embodiments of the invention are directed to methods of forming a FinFET. A non-limiting example method includes forming a fin across from a major surface of a substrate. A dummy gate is formed around a channel region of the fin. A source region or a drain region is formed on the fin, and the dummy gate is replaced with a metal gate structure. Subsequent to replacing the dummy gate with the metal gate structure, dopants are inserted into the source region or the drain region.

12 Claims, 8 Drawing Sheets

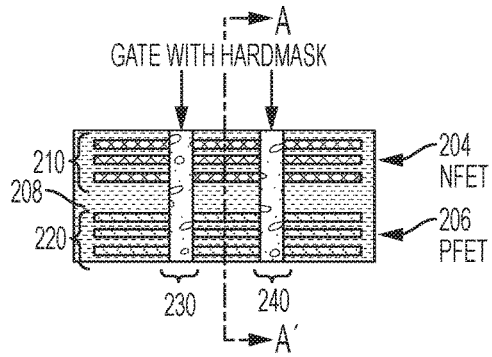
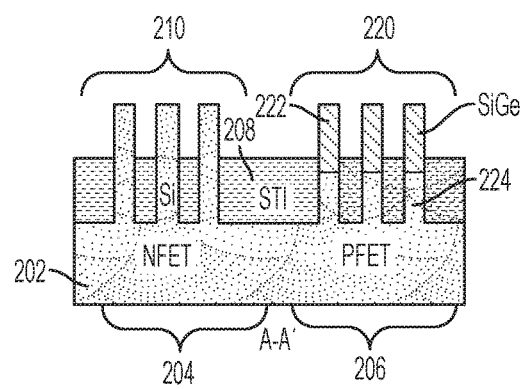
FIG. 2A    FIG. 2B
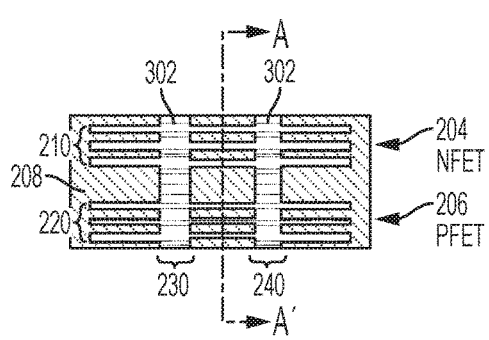
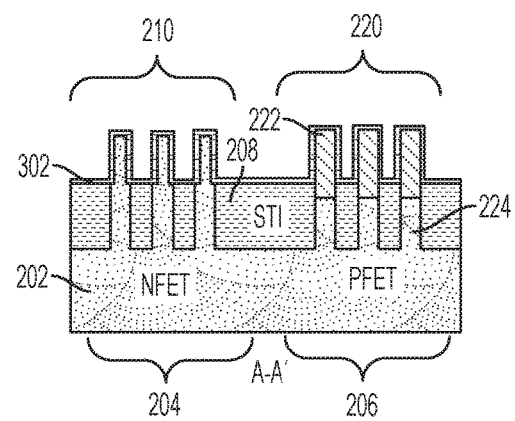
FIG. 3A    FIG. 3B

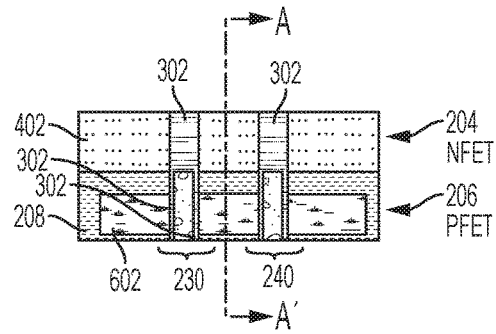 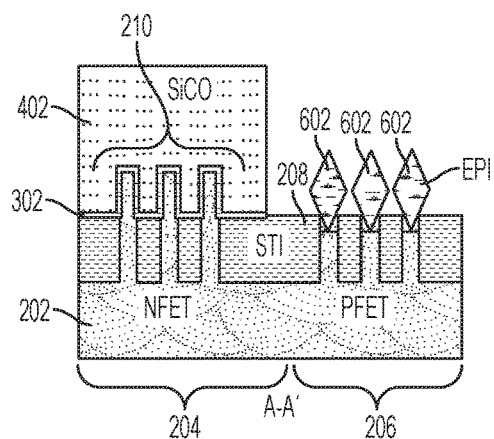
FIG. 6A  FIG. 6B
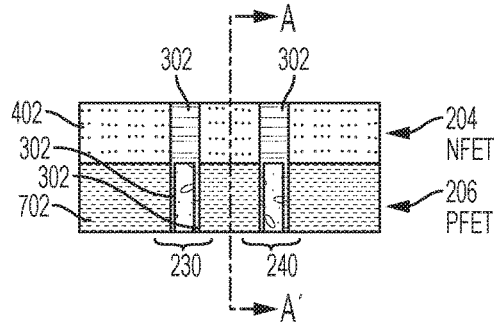 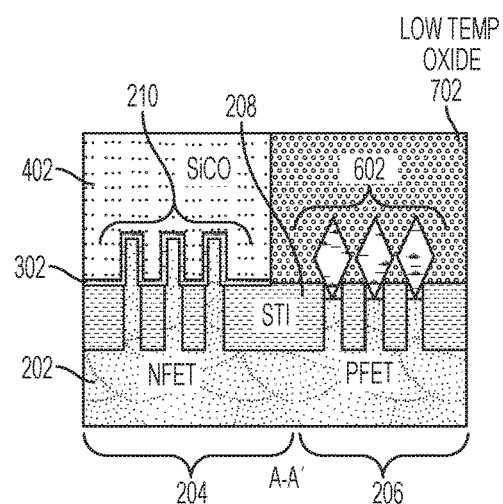
FIG. 7A  FIG. 7B

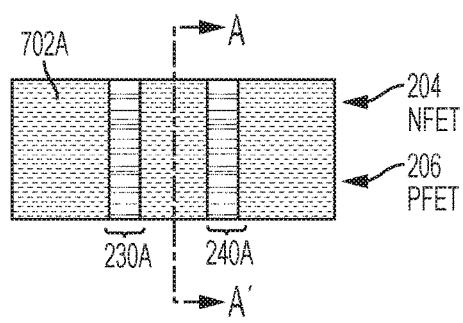
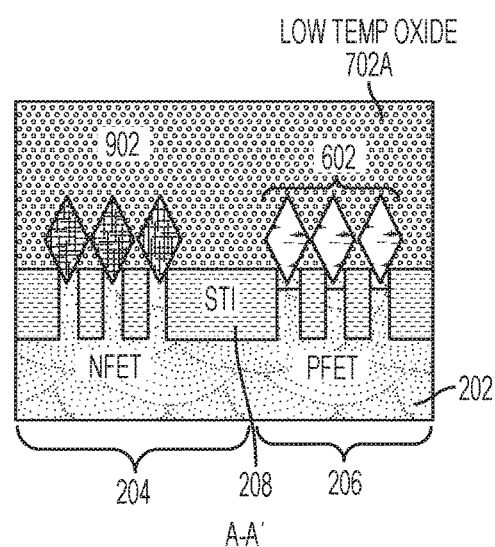
FIG. 14A
FIG. 14B

FIN-TYPE FET WITH LOW SOURCE OR DRAIN CONTACT RESISTANCE

DOMESTIC PRIORITY

This application is a continuation of U.S. application Ser. No. 15/681,476, filed Aug. 21, 2017, the contents of which are incorporated by reference herein in its entirety.

BACKGROUND

The present invention relates in general to fabrication methods and resulting structures for semiconductor devices. More specifically, the present invention relates to fabrication methods and resulting structures for fin-type field effect transistors (FinFETs) having low source/drain (S/D) contact resistance.

A FinFET is a type of non-planar transistor formed on a substrate. FinFETs are formed from a three-dimensional elongated fin that extends away from a major surface of the substrate. A gate structure is wrapped around a central portion of the fin such that the central portion forms a channel region of the FinFET device. The portions of the fin that are not under the gate structure form the source and drain regions. The elongate fin-shaped channel allows multiple gate structures to operate on a single transistor.

S/D contact resistance is a measure of the ease with which current can flow across the interface between a metal contact and the semiconductor material that forms the S/D region. As non-planar devices, FinFETs extend Moore's law allowing semiconductor manufacturers to create CPUs and memory modules that are smaller, perform faster, and consume less energy. However, smaller devices result in smaller gate pitch, which can negatively impact the device's S/D contact resistance performance.

SUMMARY

Embodiments of the invention are directed to methods of forming a FinFET. A non-limiting example method includes forming a fin across from a major surface of a substrate. A dummy gate is formed around a channel region of the fin. A source region or a drain region is formed on the fin, and the dummy gate is replaced with a metal gate structure. Subsequent to replacing the dummy gate with the metal gate structure, dopants are inserted into the source region or the drain region.

Embodiments of the invention are directed to methods of forming FinFETs. A non-limiting example method includes forming a substrate that includes a major surface having a first region and a second region. A first fin is formed across from the first region of the major surface of the substrate. A second fin is formed across from the second region of the major surface of the substrate. A first dummy gate is formed around a first channel region of the first fin. A second dummy gate is formed around a second channel region of the second fin. A first interlayer dielectric (ILD) is formed over the first region, wherein the first ILD includes a first dielectric material. A second source region or a second drain region is formed on the second fin. A second ILD is formed over the second region, wherein the second ILD includes a second dielectric material that is different from the first dielectric material. The first ILD is removed from over the first region. A first source region or a first drain region is formed on the first fin. The first dummy gate is replaced with a first metal gate structure, and the second dummy gate is replaced with a second metal gate structure.

Embodiments are directed to a configuration of FinFETs. A non-limiting example of the configuration includes a substrate that includes a major surface having a first region and a second region. A first fin is across from the first region of the major surface of the substrate. A second fin is across from the second region of the major surface of the substrate. A first metal gate is around a first channel region of the first fin, and a second metal gate is around a second channel region of the second fin. A second doped source region or a second doped drain region is on the second fin. A first doped source region or a first doped drain region is on the first fin. A first sidewall spacer is along a first sidewall of the first metal gate, and a second sidewall spacer is along a second sidewall of the second metal gate, wherein a thickness dimension of the first sidewall spacer is approximately equal to a thickness dimension of the second sidewall spacer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 2A depicts a top-down view of a configuration of n-type and p-type FinFET structures after a fabrication stage according to embodiments of the invention;

FIG. 2B depicts a cross-sectional view of the FinFET structures shown in FIG. 2A viewed along line A-A';

FIG. 3A depicts a top-down view of a configuration of n-type and p-type FinFET structures after a fabrication stage according to embodiments of the invention;

FIG. 3B depicts a cross-sectional view of the FinFET structures shown in FIG. 3A viewed along line A-A';

FIG. 6A depicts a top-down view of a configuration of n-type and p-type FinFET structures after a fabrication stage according to embodiments of the invention;

FIG. 6B depicts a cross-sectional view of the FinFET structures shown in FIG. 6A viewed along line A-A';

FIG. 7A depicts a top-down view of a configuration of n-type and p-type FinFET structures after a fabrication stage according to embodiments of the invention;

FIG. 7B depicts a cross-sectional view of the FinFET structures shown in FIG. 7A viewed along line A-A';

FIG. 14A depicts a top-down view of a configuration of n-type and p-type FinFET structures after a fabrication stage according to embodiments of the invention; and FIG. 14B depicts a cross-sectional view of the FinFET structures shown in FIG. 14A viewed along line A-A'.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are relevant to aspects of the invention, typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
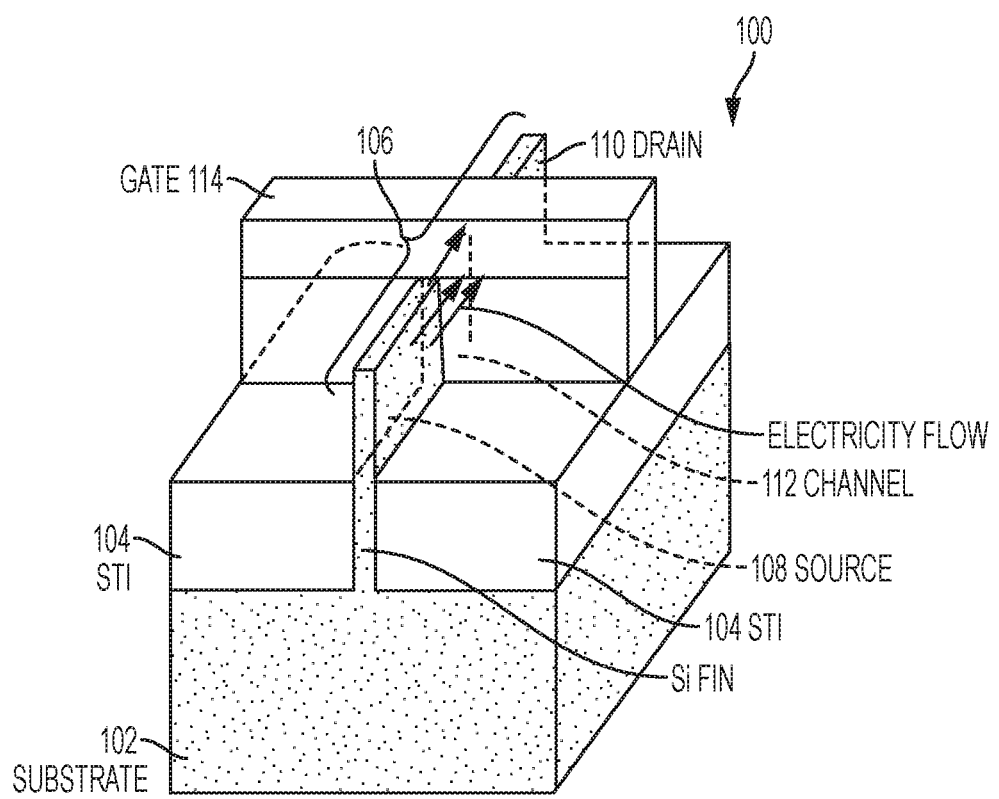
FIG. 1 is a three-dimensional view of a known FinFET device configuration.

The FinFET is a particularly advantageous type of MOSFET. FIG. 1 depicts a three-dimensional view of an exemplary FinFET 100, which includes a shallow trench isolation (STI) region 104 for isolation of active areas from one another. The basic electrical layout and mode of operation of FinFET 100 do not differ significantly from a traditional field effect transistor. FinFET 100 includes a semiconductor substrate 102, local STI region 104, a fin 106, and a gate 114 having a gate oxide layer (not shown) between the gate and the fin, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 can be silicon, and local STI region 104 can be an oxide (e.g., $SiO_2$). Fin 106 can be silicon. Gate 114 controls the source to drain current flow (labeled ELECTRICITY FLOW in FIG. 1). In contrast to a planar MOSFET, however, source 108, drain 110 and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

Early transistors were fabricated with silicon dioxide gate dielectrics and poly-silicon gate conductors. However, as transistors decreased in size, gate dielectric thickness scaled below 2 nanometers, which increases tunneling leakage currents and power consumption and reduces device reliability. Replacing the silicon dioxide gate dielectric with a high-k material having a high dielectric constant (k) in comparison to silicon dioxide allows increased gate capacitance without the associated leakage effects. Suitable high-k materials include hafnium silicate, zirconium silicate, hafnium dioxide and zirconium dioxide, typically deposited using atomic layer deposition.

Replacing the silicon dioxide gate dielectric with another material adds complexity to the fabrication process. For example, implementing the gate dielectric based on high-k oxides of hafnium requires the poly-silicon gate material to be replaced with a metal that interfaces better with the high-k dielectric. Accordingly, the poly-silicon gate must be etched out and replaced with metal. The metal-gate can be formed before or after the source and drain regions. Forming the metal gate last (i.e., after formation of the source and drain regions) is known generally as a replacement metal gate (RMG) process flow.

Known process flows for the metal gate formation involves independently optimized complex stacks of thin work-function metals topped by a bulk conductor layer. Additionally, a typical fabrication process flow includes multiple annealing operations, including, for example, a high-k post-deposition anneal (PDA) and a high temperature anneal applied to the high-k dielectric to improve reliability.

As previously noted herein, the S/D contact resistance is a measure of the ease with which current can flow across the interface between a metal contact and the semiconductor material that forms the S/D region. As non-planar devices, FinFETs extend Moore's law allowing semiconductor manufacturers to create CPUs and memory modules that are smaller, perform faster, and consume less energy. However, smaller devices result in smaller gate pitch, which can impact the ability to deliver sufficiently low S/D contact resistance.

The phrase "ohmic interface" has been used to describe an interface, e.g., a contact/source or a contact/drain interface at which the total current density J entering the interface is a function of the difference in the equilibrium Fermi levels on the two sides. An "ohmic contact" can be defined as a contact in which there is a substantially unimpeded transfer of majority carriers from one material (e.g., the metal contact) to another (e.g., the semiconductor material of the S/D region). In other words, ohmic contacts do not limit the current. One way to achieve an ohmic contact is by doping the semiconductor side (e.g., the S/D region) of the contact heavily enough (e.g., N+ or P+) that tunneling is possible.

Turning now to an overview of aspects of the present invention, one or more embodiments of the invention provide fabrication process flows and resulting FinFET device structures that use a novel fabrication process in which the RMG processes are completed prior to and separately from the S/D doping processes. Embodiments of the invention dope the semiconductor side (e.g., the S/D region) of the S/D contact heavily enough (e.g., N+ or P+) that tunneling is possible, thereby achieving sufficiently low S/D contact resistance. As used herein, N+ and/or P+ doping levels sufficient to achieve lower S/D contact resistance can be in the range from $5e^{-9}$ to $1e^{-9}$ ohm/cm$^2$ per doping concentration $5e^{20}$ to $3e^{21}$ cm$^{-3}$. In some embodiments of the invention, the S/D doping is sufficient to achieve an ohmic S/D contact resistance. As previously noted herein the phrase "ohmic interface" has been used to describe an interface, e.g., a contact/source or a contact/drain interface at which the total current density J entering the interface is a function of the difference in the equilibrium Fermi levels on the two sides. An "ohmic contact" can be defined as a contact in which there is a substantially unimpeded transfer of majority carriers from one material (e.g., the metal contact) to another (e.g., the semiconductor material of the S/D region). In other words, ohmic contacts do not limit the current. As used herein, N+ and/or P+ doping levels sufficient to achieve lower ohmic S/D contact resistance can be in the range from $5e^{-9}$ to $1e^{-9}$ ohm/cm$^2$ per doping concentration $5e^{20}$ to $3e^{21}$ cm$^{-3}$.

Implanting or otherwise doping the S/D regions amorphizes the crystalline S/D semiconductor material (e.g., Si). Accordingly, a post-doping activation anneal is applied to the doped S/D regions to re-crystallize the amorphized S/D semiconductor material. Embodiments of the invention leverage an observation that post-S/D-activation high temperature processes can introduce defects to the activated S/D regions and degrade the S/D contact resistance and/or the ohmic S/D contact resistance that was achieved through doping. Because embodiments of the invention complete the high temperature annealing operations of the RMG processes (e.g., from about 1000 to about 1025 degrees Celsius) prior to and separately from the post-doping S/D activation anneal (e.g., from about 600 to about 900 degrees Celsius), embodiments of the invention avoid the introduction of defects to the activated S/D regions, as well as the degradation of post-activation S/D contact resistance and/or post-activation ohmic S/D contact resistance, that would occur if post-activation high temperature processes are performed.

In some embodiments of the invention, n-type FinFET devices (e.g., NFETs) and p-type FinFET devices (e.g., PFETs) are formed on the same substrate using a novel self-aligned dielectric process to dope the n-type S/D regions and the p-type S/D regions. In some embodiments, NFET fins are formed in an NFET region of the substrate, and PFET fins are formed in a PFET region of the substrate. S/D regions are formed on the NFET fins, and a first interdielectric layer (ILD) is formed over the S/D regions and the NFET fins in the NFET region. S/D regions are formed on the PFET fins, and a second ILD is formed over the S/D regions and the PFET fins in the PFET region. The first ILD is formed from a first dielectric material, and the second ILD is formed from a second dielectric material. The first dielectric material is a different material than the second dielectric material. In order to dope the S/D regions in the NFET region to become n-type, the first ILD is removed selective to the second ILD to expose the S/D regions in the NFET region, and the exposed S/D regions are doped to become an n-type S/D regions. The first ILD is re-formed by applying the same first dielectric material over the n-type S/D regions and the NFET fins in the NFET region. In order to dope the S/D regions in the PFET region to become p-type, the second ILD is removed selective to the first ILD to expose the S/D regions in the PFET region, and the exposed S/D regions are doped to become a p-type S/D regions. The second ILD can be re-formed by applying the same second dielectric material over the p-type S/D regions and the PFET fins in the PFET region. By using the above-described self-aligned ILD process with different dielectric materials in the NFET region and the PFET region, embodiments of the invention eliminate the additional masking steps that would be required to block the NFET region while doping PFET region (and vice versa) when the same ILD material is used over the NFET region and the PFET region.

In some embodiments of the invention, n-type FinFET devices (e.g., NFETs) and p-type FinFET devices (e.g., PFETs) are formed on the same substrate having substantially uniform sidewall gate spacers formed in NFET region and the PFET region. In some embodiments of the invention, a layer of spacer material is deposited over the NFET region and the PFET region in the same fabrication operation. Subsequent fabrication operations, including, for example, the above-described self-aligned dielectric process based on two different ILD materials, are applied to the layer of spacer material to form the sidewall gate spacers in the NFET region and the sidewall gate spacers in the PFET region. Because the same deposition process is used to form the sidewall gate spacers in the NFET region and the sidewall gate spacers in the PFET region, a thickness dimension of the sidewall gate spacers in the NFET region is substantially the same as a thickness dimension of the sidewall gate spacers in the PFET region. The sidewall gate spacer thickness determines the distance from the S/D region to the channel portion of the fin. If this distance is different in the NFET region and the PFET region, the S/D contact resistance will be different in the NFET region and the PFET region. Accordingly, because embodiments of the invention provide substantially uniform thickness of the gate sidewall spacers in the NFET region and the PFET region, gate sidewall spacer thickness does not result in differences between the S/D contact resistance in the NFET region and the PFET region.

In some embodiments of the invention, the above-described novel fabrication process in which the RMG processes are completed prior to and separately from the S/D doping processes can be incorporated in the above-described self-aligned dielectric process that is used to dope the n-type S/D regions and the p-type S/D regions. In some embodiments of the invention, the above-described novel fabrication process in which the RMG processes are completed prior to and separately from the S/D doping processes can be incorporated in the above-described fabrication process for forming substantially uniform sidewall gate spacers in the NFET region and the PFET region.

A fabrication methodology for forming various stages of n-type FinFET (i.e., NFET) and p-type FinFET (i.e., PFET)

semiconductor devices on a substrate according to embodiments of the invention will now be described with reference to FIGS. 2A-14B. FIG. 2A depicts a top-down view of a configuration of n-type and p-type FinFET structures after a fabrication stage according to embodiments of the invention, and FIG. 2B depicts a cross-sectional view of the FinFET structures shown in FIG. 2A viewed along line A-A'. As best shown in FIG. 2B, conventional fabrication techniques (e.g., film deposition, removal/etching, patterning/lithography, polishing, chemical mechanical planarization (CMP), and the like) are used to form an initial structure having a semiconductor substrate 202 formed from a bulk semiconductor material. N-type FinFET devices will be formed in an NFET region 204 of the substrate 202, and p-type FinFET devices will be formed in a PFET region 206 of the substrate 202. Fins 210 are formed over a major surface of the substrate 202 in the NFET region 204. In some embodiments, the fins 210 are formed from silicon (Si). Fins 220 are formed over a major surface of the substrate 202 in the PFET region 206. In some embodiments, an upper portion 222 of each fin 220 is formed from silicon germanium (SiGe), and a lower portion 224 of each fin 220 is formed from Si. A shallow-trench isolation (STI) region 208 is formed by depositing a local oxide (e.g., $SiO_2$) is between fins 210, 220 and over the substrate 202. After deposition, the local oxide is polished and recessed back to form the STI regions 208, and to expose the upper portions of fins 210 and the upper portions 222 of fins 220.

As best depicted in FIG. 2A, dummy gates 230, 240 are formed over and around the fins 210, 220 in a similar manner to how the gate 114 (shown in FIG. 1) is formed over and around the fin 106 (shown in FIG. 1). The dummy gates 230, 240 can each be formed having a poly-silicon fin-shaped body with a hardmask formed on top of the dummy gate body.

FIG. 3A depicts a top-down view and FIG. 3B depicts a cross-sectional view along line A-A' of the configuration of n-type and p-type FinFET structures after a uniform thickness layer 302 of spacer material (e.g., SiBCN) is deposited everywhere over the NFET region 210 and the PFET region 220 of substrate 202. In some embodiments of the invention, the uniform spacer layer 302 is deposited using an isotropic deposition process. For ease of illustration, the spacer layer 302 is shown in FIG. 3A over the fins 210, 220 and the dummy gate structures 230, 240 but not over the STI regions 208. However, in practice, at this stage of the fabrication operation, the uniform spacer layer 302 is present over the STI region 208 as well.

Figure 4A:
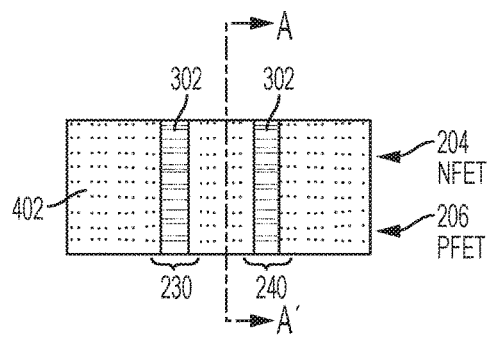
FIG. 4A depicts a top-down view of a configuration of n-type and p-type FinFET structures after a fabrication stage according to embodiments of the invention.
Figure 4B:
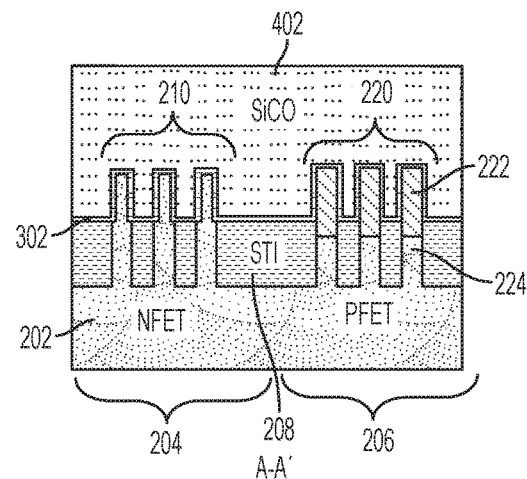
FIG. 4B depicts a cross-sectional view of the FinFET structures shown in FIG. 4A viewed along line A-A'.

FIG. 4A depicts a top-down view and FIG. 4B depicts a cross-sectional view along line A-A' of the configuration of n-type and p-type FinFET structures after a first ILD (e.g., SiCO) 402 is deposited over the NFET region 204 and the PFET region 206 of the substrate 202. As best shown in FIG. 4A, the first ILD 402 is polished back to expose top portions of the dummy gates 230, 240.

Figure 5A:
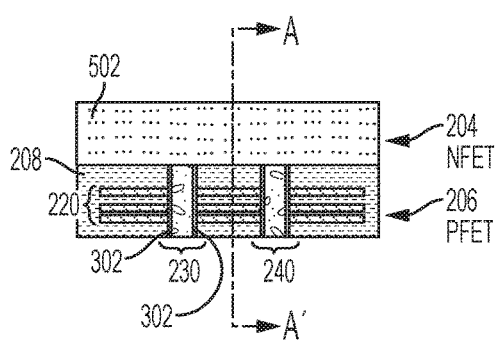
FIG. 5A depicts a top-down view of a configuration of n-type and p-type FinFET structures after a fabrication stage according to embodiments of the invention.
Figure 5B:
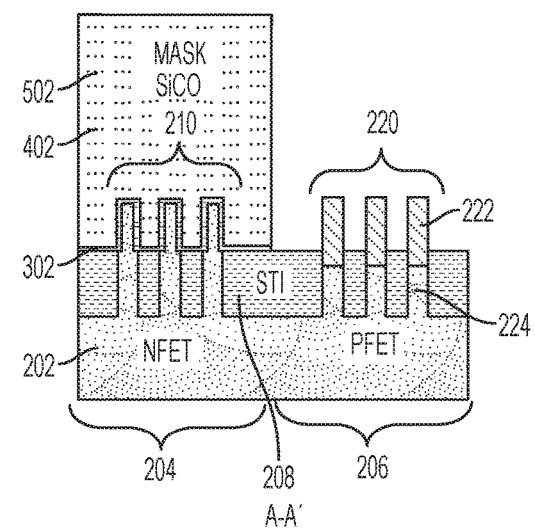
FIG. 5B depicts a cross-sectional view of the FinFET structures shown in FIG. 5A viewed along line A-A'.

FIG. 5A depicts a top-down view and FIG. 5B depicts a cross-sectional view along line A-A' of the configuration of n-type and p-type FinFET structures after a mask 502 has been formed over the first ILD 402 in the NFET region 204 and the portion of the first ILD 402 that is unmasked and over the PFET region 206 has been removed. In some embodiments, the first ILD 402 is removed in the PFET region 206 using a reactive ion etch (RIE) process. Portions of the uniform spacer layer 302 are removed in the PFET region 206 using a timed directional etch (e.g., a RIE) that is applied until the uniform spacer layer 302 is removed from the surfaces that are substantially parallel with the major surface of the substrate 202. As shown in FIG. 5B, the timed directional etch is stopped such that the uniform spacer layer 302 is only present along the sidewalls of the dummy gate structures 230, 240.

FIG. 6A depicts a top-down view and FIG. 6B depicts a cross-sectional view along line A-A' of the configuration of n-type and p-type FinFET structures after the mask 502 has been removed and S/D regions 602 have been formed over the upper portions 222 of the fins 220. In one or more embodiments, the S/D regions 602 are formed by an epitaxial growth process that deposits a crystalline overlayer of semiconductor material onto the exposed crystalline seed material of the upper portions 222 of the fins 220. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

FIG. 7A depicts a top-down view and FIG. 7B depicts a cross-sectional view along line A-A' of the configuration of n-type and p-type FinFET structures after an oxide 702 (e.g., a low temperature oxide) has been deposited over the PFET region 206 of the substrate 202 and polished back (e.g., using CMP) to the level of the first ILD 402.

Figure 8A:
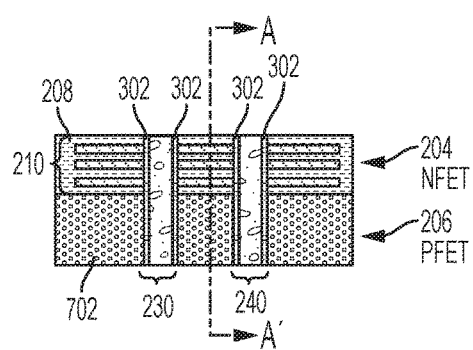
FIG. 8A depicts a top-down view of a configuration of n-type and p-type FinFET structures after a fabrication stage according to embodiments of the invention.
Figure 8B:
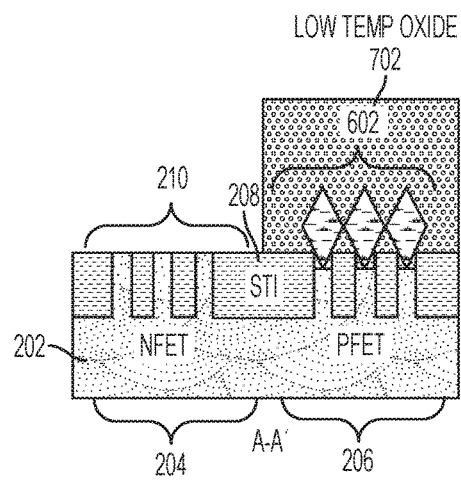
FIG. 8B depicts a cross-sectional view of the FinFET structures shown in FIG. 8A viewed along line A-A'.

FIG. 8A depicts a top-down view and FIG. 8B depicts a cross-sectional view along line A-A' of the configuration of n-type and p-type FinFET structures after the first ILD 402 in the NFET region 204 has been removed. In some embodiments, the first ILD 402 is removed in the NFET region 204 using a reactive ion etch (RIE) process. Portions of the uniform spacer layer 302 are removed in the NFET region 204 using a timed directional etch (e.g., a RIE) that is applied until the uniform spacer layer 302 is removed from the surfaces that are substantially parallel with the major surface of the substrate 202. As shown in FIG. 8B, the timed directional etch is stopped such that the uniform spacer layer 302 is only present along the sidewalls of the dummy gate structures 230, 240 in the NFET region 204. Accordingly, after the fabrication operation shown in FIGS. 8A and 8B, the uniform spacer layer 302 only remains along the sidewalls of the dummy gate structures 230, 240 in both the NFET region 204 and the PFET region 206.

Figure 9A:
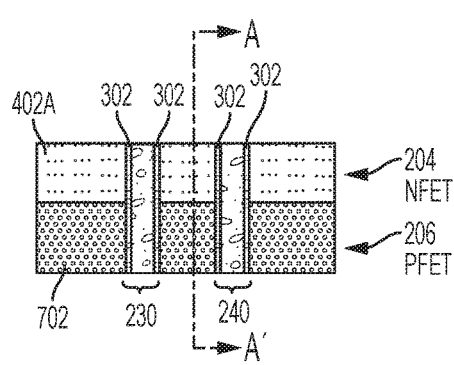
FIG. 9A depicts a top-down view of a configuration of n-type and p-type FinFET structures after a fabrication stage according to embodiments of the invention.
Figure 9B:
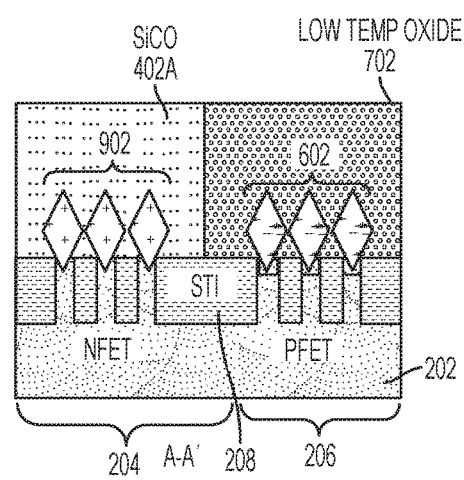
FIG. 9B depicts a cross-sectional view of the FinFET structures shown in FIG. 9A viewed along line A-A'.

FIG. 9A depicts a top-down view and FIG. 9B depicts a cross-sectional view along line A-A' of the configuration of n-type and p-type FinFET structures after S/D regions 902 have been formed over the upper portions of the fins 210, and after a replacement first ILD 402A has been formed in the NFET region 204 of the substrate 202 and polished back (e.g., using CMP) to the level of the oxide 702. In one or more embodiments, the S/D regions 902 are formed by an epitaxial growth process that deposits a crystalline overlayer of semiconductor material onto the exposed crystalline seed material of the upper portions of the fins 220. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

Figure 10A:
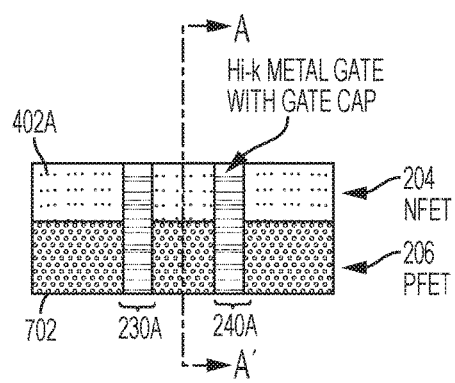
FIG. 10A depicts a top-down view of a configuration of n-type and p-type FinFET structures after a fabrication stage according to embodiments of the invention.
Figure 10B:
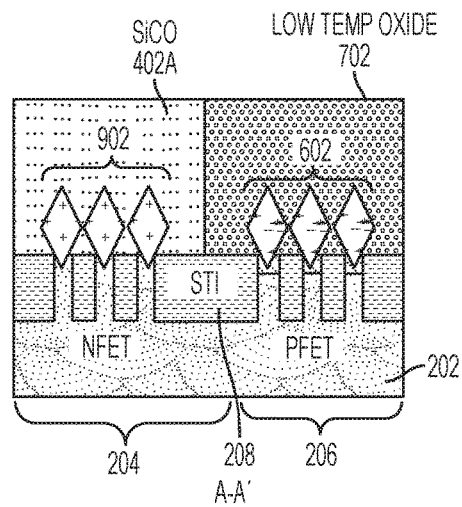
FIG. 10B depicts a cross-sectional view of the FinFET structures shown in FIG. 10A viewed along line A-A'.

FIG. 10A depicts a top-down view and FIG. 10B depicts a cross-sectional view along line A-A' of the configuration of n-type and p-type FinFET structures after a RMG process has been used to replace the dummy gates 230, 240 with metal gates 230A, 240A. The dummy gates 230, 240 can be removed using a wet or dry isotropic etching process, e.g., RIE or chemical oxide removal (COR), to form a trench between the gate sidewall spacers 302. The gate metal 230A, 240A can subsequently be deposited within the trench between the gate sidewall spacers 302. More specifically, a metal liner, e.g., a work-function metal, and a gate metal can then be deposited on a high-k dielectric material to complete the gate formation. In one or more embodiments, the metal liner can be, for example, TiN or TaN, and the gate metal can be aluminum or tungsten. Known process flows for the metal gate formation involves multiple annealing operations, including, for example, a high-k post-deposition anneal (PDA) and a high temperature anneal applied to the high-k dielectric to improve reliability.

Figure 11A:
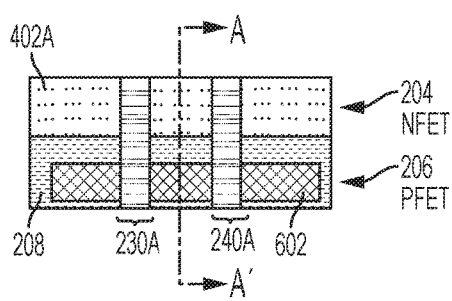
FIG. 11A depicts a top-down view of a configuration of n-type and p-type FinFET structures after a fabrication stage according to embodiments of the invention.
Figure 11B:
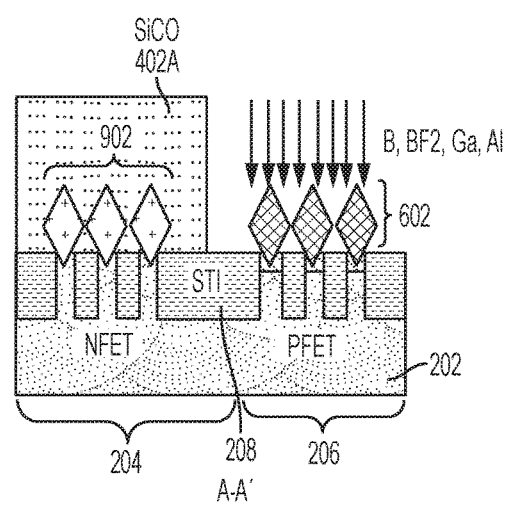
FIG. 11B depicts a cross-sectional view of the FinFET structures shown in FIG. 11A viewed along line A-A'.

FIG. 11A depicts a top-down view and FIG. 11B depicts a cross-sectional view along line A-A' of the configuration of n-type and p-type FinFET structures after the oxide 702 has been removed (e.g., using an isotropic etch selective to low temperature oxides) and the S/D regions 602 have been doped. In one or more embodiments, the S/D regions 602 are doped by implantation, using, for example, B, $BF_2$, Ga, Al, and the like. In accordance with embodiments of the invention, the RMG processes are completed prior to and separately from the S/D doping processes. Embodiments of the invention dope the semiconductor side (e.g., the S/D regions 602) of the S/D contact heavily enough (e.g., N+ or P+) that tunneling is possible, thereby achieving sufficiently low S/D contact resistance. In some embodiments of the invention, the S/D doping is sufficient to achieve an ohmic S/D contact resistance. As previously noted herein the phrase "ohmic interface" has been used to describe an interface, e.g., a contact/source or a contact/drain interface at which the total current density J entering the interface is a function of the difference in the equilibrium Fermi levels on the two sides. An "ohmic contact" can be defined as a contact in which there is a substantially unimpeded transfer of majority carriers from one material (e.g., the metal contact) to another (e.g., the semiconductor material of the S/D region). In other words, ohmic contacts do not limit the current.

Implanting or otherwise doping the S/D regions 602 amorphizes the crystalline S/D semiconductor material (e.g., Si or SiGe). Accordingly, a post-doping activation anneal is applied to the doped S/D regions 602 to re-crystallize the amorphized semiconductor material of the S/D regions 602. Embodiments of the invention leverage an observation that post-S/D-activation high temperature processes (e.g., RMG processes) can introduce defects to the activated S/D regions 602 and degrade the S/D contact resistance and/or the ohmic S/D contact resistance that was achieved through doping. Because embodiments of the invention complete the high temperature annealing operations of the RMG processes prior to and separately from the post-doping S/D activation anneal, embodiments of the invention avoid the introduction of defects to the activated S/D regions 602, as well as the degradation of post-activation S/D contact resistance and/or post-activation ohmic S/D contact resistance, that would occur if high temperature processes (e.g., RMG processes) are performed post-activation.

Figure 12A:
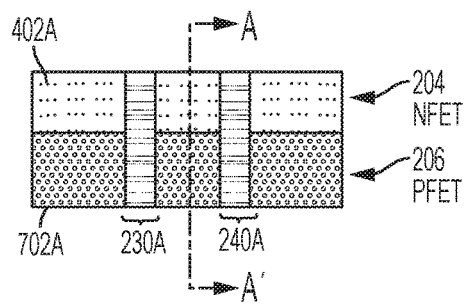
FIG. 12A depicts a top-down view of a configuration of n-type and p-type FinFET structures after a fabrication stage according to embodiments of the invention.
Figure 12B:
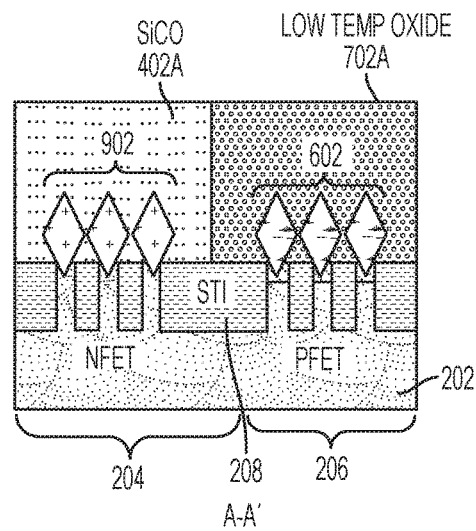
FIG. 12B depicts a cross-sectional view of the FinFET structures shown in FIG. 12A viewed along line A-A'.

FIG. 12A depicts a top-down view and FIG. 12B depicts a cross-sectional view along line A-A' of the configuration of n-type and p-type FinFET structures after a replacement oxide 702A has been formed in the PFET region 206 of the substrate 202 and polished back (e.g., using CMP) to the level of the replacement first ILD 402A.

Figure 13A:
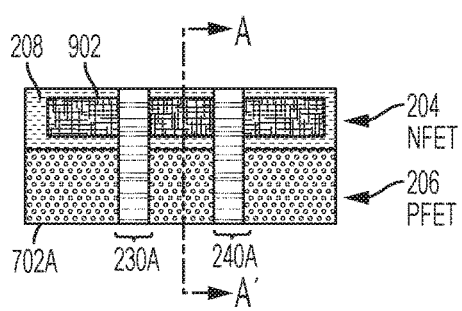
FIG. 13A depicts a top-down view of a configuration of n-type and p-type FinFET structures after a fabrication stage according to embodiments of the invention.
Figure 13B:
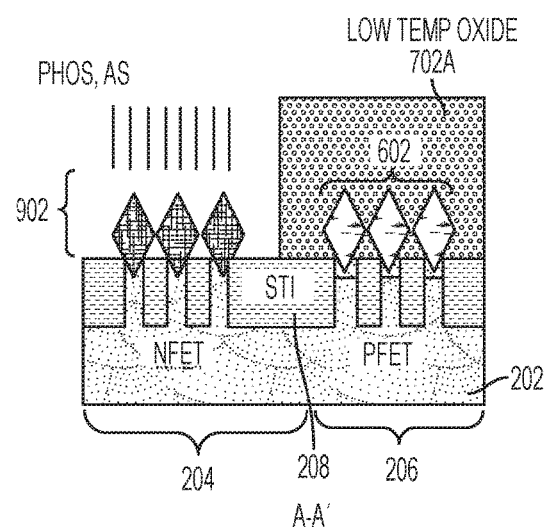
FIG. 13B depicts a cross-sectional view of the FinFET structures shown in FIG. 13A viewed along line A-A'.

FIG. 13A depicts a top-down view and FIG. 13B depicts a cross-sectional view along line A-A' of the configuration of n-type and p-type FinFET structures after the oxide 702A has been removed (e.g., using an isotropic etch selective to SiCO) and the S/D regions 902 have been doped. In one or more embodiments, the S/D regions 902 are doped by implantation, using, for example, Phosphorous, As, and the like. In accordance with embodiments of the invention, the RMG processes are completed prior to and separately from the S/D doping processes. Embodiments of the invention dope the semiconductor side (e.g., the S/D regions 902) of the S/D contact heavily enough (e.g., N+ or P+) that tunneling is possible, thereby achieving sufficiently low S/D contact resistance. In some embodiments of the invention, the S/D doping is sufficient to achieve an ohmic S/D contact resistance. As previously noted herein the phrase "ohmic interface" has been used to describe an interface, e.g., a contact/source or a contact/drain interface at which the total current density J entering the interface is a function of the difference in the equilibrium Fermi levels on the two sides. An "ohmic contact" can be defined as a contact in which there is a substantially unimpeded transfer of majority carriers from one material (e.g., the metal contact) to another (e.g., the semiconductor material of the S/D region). In other words, ohmic contacts do not limit the current.

Implanting or otherwise doping the S/D regions 902 amorphizes the crystalline S/D semiconductor material (e.g., Si or SiGe). Accordingly, a post-doping activation anneal is applied to the doped S/D regions 902 to re-crystallize the amorphized semiconductor material of the S/D regions 902. Embodiments of the invention leverage an observation that post-S/D-activation high temperature processes (e.g., RMG processes) can introduce defects to the activated S/D regions 902 and degrade the S/D contact resistance and/or the ohmic S/D contact resistance that was achieved through doping.

Because embodiments of the invention complete the high temperature annealing operations of the RMG processes prior to and separately from the post-doping S/D activation anneal, embodiments of the invention avoid the introduction of defects to the activated S/D regions 902, as well as the degradation of post-activation S/D contact resistance and/or post-activation ohmic S/D contact resistance, that would occur if high temperature processes (e.g., RMG processes) are performed post-activation.

FIG. 14A depicts a top-down view and FIG. 14B depicts a cross-sectional view along line A-A' of the configuration of n-type and p-type FinFET structures after a replacement oxide 702A has been formed in the NFET region 204 of the substrate 202 and polished back (e.g., using CMP) to the level of the replacement oxide 702A formed in the PFET region 206, which results in a single oxide 702A (e.g., a low temperature oxide) extending through over the NFET region 204 and the PFET region 206 and below the metal gates 230A, 240A. In accordance with embodiments of the invention, S/D contacts can be provided through the oxide 702A to the S/D regions 602, 902. In accordance with embodiments of the invention, because the high temperature annealing operations of the RMG processes are completed prior to and separately from the post-doping S/D activation anneal, embodiments of the invention avoid the introduction of defects to the activated S/D regions 902, 602, as well as the degradation of post-activation S/D contact resistance and/or post-activation ohmic S/D contact resistance, that would occur if high temperature processes (e.g., RMG processes) are performed post-activation.

In some embodiments of the invention, the S/D regions 602, 902 can be doped in-situ during epitaxial growth of the S/D regions 602, 902. For example, in some embodiments, epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. In embodiments of the invention where in-situ doping is used, the S/D regions can be grown in an environment that has a sufficiently high temperature that a separate activation anneal is not necessary. In such embodiments of the invention, the RMG process is performed prior to epitaxial growth of the S/D regions 602, 902 to avoid the introduction of defects to the in-situ doped and activated S/D regions 902, 602, as well as the degradation of post-activation S/D contact resistance and/or post-activation ohmic S/D contact resistance, that would occur if high temperature processes (e.g., RMG processes) are performed post-activation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming fin-type field effect transistors (FinFETs), the method comprising:
   forming a substrate comprising a major surface having a first region and a second region;
   forming a first fin across from the first region of the major surface of the substrate;
   forming a second fin across from the second region of the major surface of the substrate;
   forming a first dummy gate around a first channel region of the first fin;
   forming a second dummy gate around a second channel region of the second fin;
   forming a first interlayer dielectric (ILD) over the first region, wherein the first ILD comprises a first dielectric material;
   forming a second source region or a second drain region on the second fin;
   forming a second ILD over the second region, wherein the second ILD comprises a second dielectric material that is different from the first dielectric material;
   removing the first ILD from over the first region;
   forming a first source region or a first drain region on the first fin;
   replacing the first dummy gate with a first metal gate structure; and
   replacing the second dummy gate with a second metal gate structure.

2. The method of claim 1 further comprising, subsequent to replacing the first dummy gate with the first metal gate structure, removing the first ILD and inserting first dopants into the first source region or the first drain region.

3. The method of claim 2 further comprising, subsequent to replacing the second dummy gate with the second metal gate structure, replacing the first ILD with a third ILD, removing the second ILD, and inserting second dopants into the second source region or the second drain region.

4. The method of claim 1 further comprising forming a first sidewall spacer along a first sidewall of the first dummy gate.

5. The method of claim 4 further comprising forming a second sidewall spacer along a second sidewall of the second dummy gate.

6. The method of claim 5, wherein a thickness dimension of the first sidewall spacer is approximately equal to a thickness dimension of the second sidewall spacer.

7. The method of claim 5, wherein the first sidewall spacer and the second sidewall spacer are formed by the same operation.

8. The method of claim 1, wherein:
   replacing the first dummy gate with the first metal gate structure comprises an annealing operation; and
   replacing the second dummy gate with the second metal gate structure comprising another annealing operation.

9. The method of claim 1 further comprising:
subsequent to replacing the first dummy gate with the first metal gate structure, performing a first re-crystallization operation on the first source region or the first drain region; and
subsequent to replacing the second dummy gate with the second metal gate structure, performing a second re-crystallization operation on the second source region or the second drain region.

10. The method of claim 1, wherein the second fin comprises silicon (Si).

11. The method of claim 1, wherein the first fin comprises silicon germanium (SiGe).

12. The method of claim 1, wherein:
the dopants of the first source region or the first drain region comprise n-type dopants; and
the dopants of the second source region or the second drain region comprise p-type dopants.

\* \* \* \* \*